(12) United States Patent
Kanemoto et al.

(10) Patent No.: US 8,796,845 B2
(45) Date of Patent: Aug. 5, 2014

(54) ELECTRONIC DEVICE COVERED BY MULTIPLE LAYERS AND METHOD FOR MANUFACTURING ELECTRONIC DEVICE

(75) Inventors: Yoko Kanemoto, Fujimi (JP); Akira Sato, Fujimi (JP); Shogo Inaba, Shiojiri (JP)

(73) Assignee: Seiko Epson Corporation (JP)

( * ) Notice: Subject to any disclaimer, the term of this patent is extended or adjusted under 35 U.S.C. 154(b) by 163 days.

(21) Appl. No.: 13/286,494

(22) Filed: Nov. 1, 2011

(65) Prior Publication Data

US 2012/0104593 A1  May 3, 2012

(30) Foreign Application Priority Data

Nov. 2, 2010 (JP) ................. 2010-245974

(51) Int. Cl.
*H01L 23/02* (2006.01)
*H01L 23/06* (2006.01)
*H01L 23/04* (2006.01)

(52) U.S. Cl.
USPC .... 257/729; 257/678; 257/730; 257/E23.001; 257/E23.022

(58) Field of Classification Search
None
See application file for complete search history.

(56) References Cited

U.S. PATENT DOCUMENTS

| | | | |
|---|---|---|---|
| 7,709,912 B2 | 5/2010 | Sato et al. | |
| 7,876,167 B1 * | 1/2011 | McCraith et al. | 331/116 M |
| 7,880,245 B2 | 2/2011 | Sato et al. | |
| 7,994,594 B2 | 8/2011 | Inaba et al. | |
| 2007/0164410 A1 * | 7/2007 | Kim et al. | 257/678 |
| 2008/0017974 A1 * | 1/2008 | Franosch et al. | 257/704 |
| 2009/0179287 A1 * | 7/2009 | Inaba | 257/415 |
| 2010/0003789 A1 * | 1/2010 | Caplet et al. | 438/124 |
| 2011/0053321 A1 * | 3/2011 | Huang | 438/127 |
| 2011/0089521 A1 | 4/2011 | Sato et al. | |

FOREIGN PATENT DOCUMENTS

| | | |
|---|---|---|
| JP | 2008-114354 | 5/2008 |
| JP | 2008-221435 | 9/2008 |
| JP | 2009-105411 | 5/2009 |
| JP | 2009-184102 | 8/2009 |
| JP | 2009-188785 | 8/2009 |
| JP | 2010-030020 | 2/2010 |
| JP | 2010-158734 | 7/2010 |

* cited by examiner

*Primary Examiner* — Amar Movva
*Assistant Examiner* — Harpreet Singh
(74) *Attorney, Agent, or Firm* — Harness, Dickey & Pierce, P.L.C.

(57) ABSTRACT

An electronic device according to the invention includes: a substrate; an MEMS structure formed above the substrate; and a covering structure defining a cavity in which the MEMS structure is arranged, wherein the covering structure has a first covering layer covering from above the cavity and having a through-hole in communication with the cavity and a second covering layer formed above the first covering layer and closing the through-hole, the first covering layer has a first region located above at least the MEMS structure and a second region located around the first region, the first covering layer is thinner in the first region than in the second region, and a distance between the substrate and the first covering layer in the first region is longer than a distance between the substrate and the first covering layer in the second region.

6 Claims, 6 Drawing Sheets

ELECTRONIC DEVICE COVERED BY MULTIPLE LAYERS AND METHOD FOR MANUFACTURING ELECTRONIC DEVICE

BACKGROUND

1. Technical Field

The present invention relates to an electronic device and a method for manufacturing the electronic device.

2. Related Art

Electronic devices including a functional element, such as an MEMS (micro electro mechanical system), arranged in a cavity disposed on a substrate have been generally known. An MEMS, such as a microvibrator, a microsensor, or a microactuator, is housed in the cavity in an operable state because the minute structure needs to be arranged in such a state that it can vibrate, deform, or perform other motions.

As a method for forming a cavity, JP-A-2009-188785 discloses a forming method in which an MEMS structure is formed on a substrate, an inter-layer insulating layer is formed on the MEMS structure, a first covering layer having through-holes is formed, the inter-layer insulating layer is removed through the through-holes of the first covering layer to release the MEMS structure, and, finally, the through-holes of the first covering layer are covered with a second covering layer.

However, such a problem that the MEMS structure and the first covering layer contact each other sometimes occurs due to an external impact or the like. When the problem occurs, the MEMS structure cannot operate stably, thereby leading to a reduction in reliability. Especially in recent years, the distance between the MEMS structure and the first covering layer becomes short in response to the demand for miniaturization of the electronic devices, which is likely to cause the problem described above.

SUMMARY

An advantage of some aspects of the invention is to provide a highly reliable electronic device. Moreover, another advantage of some aspects of the invention is to provide a method for manufacturing the highly reliable electronic device.

An electronic device according to one aspect of the invention includes: a substrate; an MEMS structure formed above the substrate; and a covering structure defining a cavity in which the MEMS structure is arranged, wherein the covering structure has a first covering layer covering from above the cavity and having a through-hole in communication with the cavity and a second covering layer formed above the first covering layer and closing the through-hole, the first covering layer has a first region located above at least the MEMS structure and a second region located around the first region, the first covering layer is thinner in the first region than in the second region, and a distance between the substrate and the first covering layer in the first region is longer than a distance between the substrate and the first covering layer in the second region.

According to the electronic device, compared with the case where, for example, a flat first covering layer covers the top of the cavity, it is possible to prevent the contact between the first covering layer and the MEMS structure due to an external impact or the like. Accordingly, the electronic device can have high reliability.

It is noted that, in the descriptions concerning the invention, the term 'above' may be used, for example, in a manner as "a specific element (hereinafter referred to as 'A') is formed 'above' another specific element (hereinafter referred to as 'B')". In the case of such an example, the term 'above' is used, while assuming that it includes the case where A is formed directly on B, and the case where A is formed above B through another element.

The electronic device according to the aspect of the invention may be configured such that the first covering layer has a first layer formed in the second region so as to avoid the first region and a second layer formed in the first region and the second region, and the through-hole is formed through the first covering layer in the first region.

According to this configuration, when the inter-layer insulating layer is etched through the through-hole to release the MEMS structure, it is possible to prevent a step portion from being formed on the inner wall of the through-hole due to the difference in etching rate between the layers, compared with the case where, for example, the through-hole is formed in the second region where the number of stacked layers is large.

The electronic device according to the aspect of the invention may be configured such that the first covering layer further has a third layer formed in the first region and the second region, the first layer is formed below the second layer, the third layer is formed above the second layer, the material of the second layer is an Al—Cu alloy, and the material of the first layer and the third layer is at least any one of TiN, Ti, W, Au, and Pt, or an alloy thereof.

According to this configuration, the first covering layer can ensure conductivity while having high resistance to an etchant in releasing the MEMS structure.

The electronic device according to the aspect of the invention may be configured such that the planar shape of the first region is circular.

According to this configuration, stress can be uniformly released at the outer periphery of the first region in releasing the MEMS structure (which will be described in detail later). For example, when the planar shape of the first region is quadrilateral, stress is concentrated on corners, and, therefore, it is sometimes difficult to stably displace the first covering layer in the first region upward.

The electronic device according to the aspect of the invention may be configured such that the MEMS structure includes a first electrode formed above the substrate and a second electrode having a supporting portion formed above the substrate and a beam portion extending from the supporting portion and arranged to face the first electrode.

According to this configuration, the MEMS structure can function as a vibrator.

The electronic device according to the aspect of the invention may be configured such that the electronic device further includes an oscillator circuit for oscillating the MEMS structure.

According to this configuration, the electronic device can function as an oscillator.

A method for manufacturing an electronic device according to one aspect of the invention includes: forming an MEMS structure above a substrate; forming an inter-layer insulating layer above the substrate and the MEMS structure; forming, above the inter-layer insulating layer, a first covering layer having a through-hole; removing, through the through-hole, the inter-layer insulating layer above the MEMS structure; and forming, above the first covering layer, a second covering layer closing the through-hole, wherein in the forming of the first covering layer, the first covering layer is formed so as to be thinner in a first region located above at least the MEMS structure than in a second region located around the first region, and in the forming of the second covering layer, the first covering layer in the first region is displaced above the first covering layer in the second region.

According to the method for manufacturing the electronic device, it is possible to make the distance between the substrate and the first covering layer in the first region longer than the distance between the substrate and the first covering layer in the second region. Therefore, it is possible to prevent the contact between the first covering layer and the MEMS structure, whereby an electronic device with high reliability can be provided.

The method for manufacturing the electronic device according to the aspect of the invention may be configured such that the forming of the first covering layer includes forming a first layer above the inter-layer insulating layer, removing the first layer in the first region to expose the inter-layer insulating layer, forming a second layer above the inter-layer insulating layer in the first region and above the first layer in the second region, and forming the through-hole through the second layer in the first region.

According to this configuration, when the inter-layer insulating layer is etched through the through-hole to release the MEMS structure, it is possible to prevent a step portion from being formed on the inner wall of the through-hole due to the difference in etching rate between the layers, compared with the case where, for example, the through-hole is formed in the second region where the number of stacked layers is large.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings.

1. Electronic Device

Figure 1:
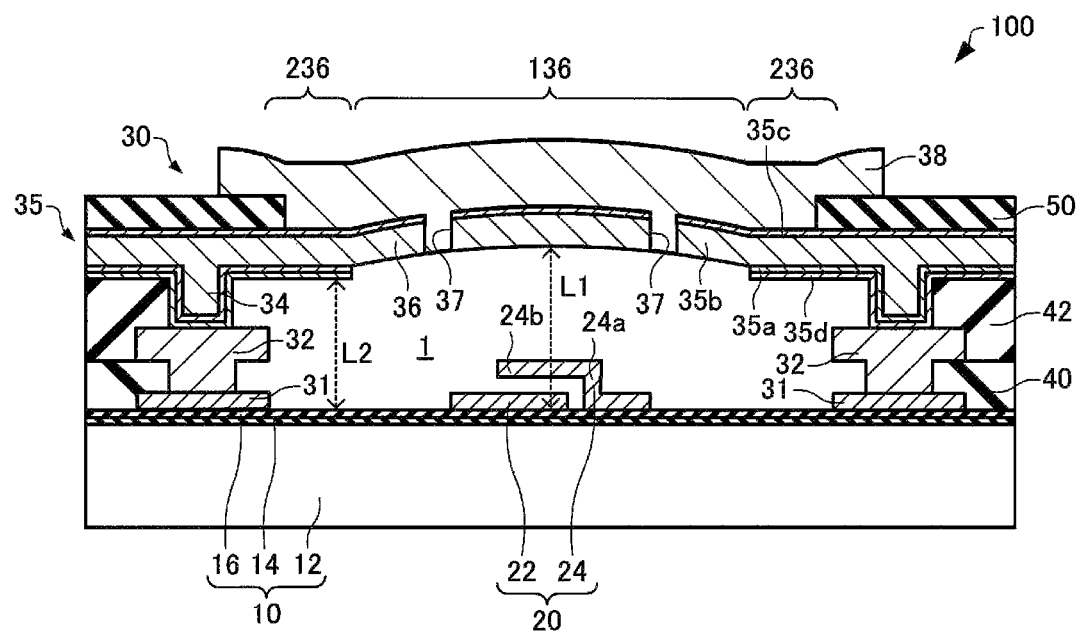
FIG. 1 is a cross-sectional view schematically showing an electronic device according to an embodiment.
Figure 2:
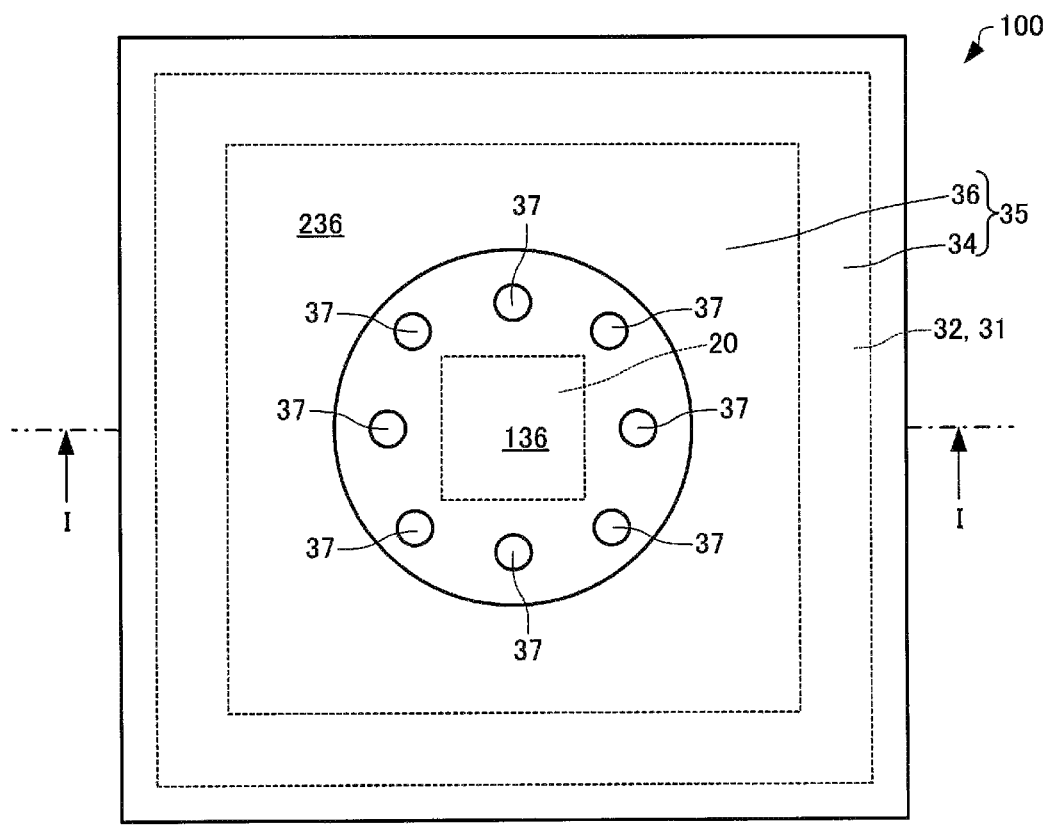
FIG. 2 is a plan view schematically showing the electronic device according to the embodiment.
Figure 3:
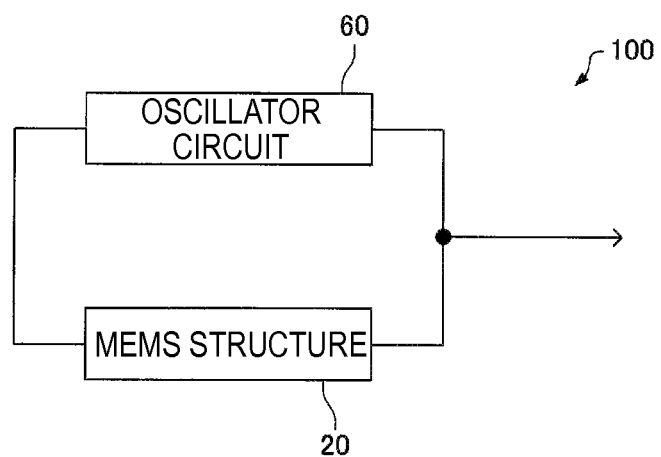
FIG. 3 schematically shows the electronic device according to the embodiment.

First, an electronic device according to an embodiment will be described with reference to the drawings. FIG. 1 is a cross-sectional view schematically showing the electronic device 100 according to the embodiment. FIG. 2 is a plan view schematically showing the electronic device 100 according to the embodiment. FIG. 3 schematically shows the electronic device 100 according to the embodiment. Here, FIG. 1 is a cross-sectional view taken along line I-I of FIG. 2. In FIG. 2, a second covering layer 38 and a passivation layer 50 are not illustrated for the sake of convenience. In FIG. 3, only an MEMS structure 20 and an oscillator circuit 60 are illustrated for the sake of convenience.

As shown in FIGS. 1 to 3, the electronic device 100 includes a substrate 10, the MEMS structure 20, and a covering structure 30. Further, the electronic device 100 can include inter-layer insulating layers 40 and 42, the passivation layer 50, and the oscillator circuit 60.

The substrate 10 can have a supporting substrate 12, a first under layer 14, and a second under layer 16.

As the supporting substrate 12, for example, a semiconductor substrate, such as a silicon substrate, can be used. As the supporting substrate 12, various substrates, such as a ceramics substrate, a glass substrate, a sapphire substrate, a diamond substrate, and a synthetic resin substrate, may be used. The thickness of the supporting substrate 12 is, for example, from 200 to 400 μm.

The first under layer 14 is formed on the supporting substrate 12. As the first under layer 14, for example, a trench insulating layer, an LOCOS (local oxidation of silicon) insulating layer, or a semi-recessed LOCOS insulating layer can be used. The first under layer 14 can electrically isolate the MEMS structure 20 from other elements.

The second under layer 16 is formed on the first under layer 14. Examples of the material of the second under layer 16 include, for example, silicon nitride. The second under layer 16 can function as an etching stopper layer in forming a cavity 1.

The MEMS structure 20 is housed in the cavity 1. The MEMS structure 20 is, for example, a vibrator having a first electrode 22 formed on the second under layer 16 and a second electrode 24 formed spaced apart from the first electrode 22. The second electrode 24 has a supporting portion 24a formed on the second under layer 16 and a beam portion 24b extending from the supporting portion 24a and arranged to face the first electrode 22. The height of the MEMS structure 20 (the distance between the upper surface of the beam portion 24b and the substrate 10) is, for example, from 0.5 to 1 μm. Examples of the material of the first electrode 22 and the second electrode 24 include, for example, polycrystalline silicon doped with a predetermined impurity to provide conductivity.

As shown in FIG. 3, the oscillator circuit 60 is electrically connected to the MEMS structure 20. When a voltage is applied between the electrodes 22 and 24 from the oscillator circuit 60, the beam portion 24b can vibrate with an electrostatic force generated between the electrodes 22 and 24. Then, the MEMS structure 20 can oscillate at a resonant frequency with the oscillator circuit 60. That is, the electronic device 100 can function as an oscillator including the MEMS structure (vibrator) 20 and the oscillator circuit 60.

Transistors, capacitors, and the like of which the oscillator circuit 60 is composed may be formed on, for example, the supporting substrate 12. Thus, the MEMS structure 20 and the oscillator circuit 60 can be formed monolithically.

The MEMS structure 20 may be, for example, various functional elements, such as a quartz-crystal vibrator, an SAW (surface acoustic wave) element, an acceleration sensor, a gyroscope, and a microactuator, other than the vibrator described above. That is, the electronic device 100 can include any functional element which can be housed in the cavity 1.

The inter-layer insulating layers 40 and 42 are formed on the second under layer 16. In the example shown in FIG. 1, the inter-layer insulating layers 40 and 42 are stacked in this order from the side of the second under layer 16. Although, in the example shown in FIG. 1, the electronic device 100 has two inter-layer insulating layers, the number of layers is not particularly limited. Examples of the material of the inter-layer insulating layers 40 and 42 include, for example, silicon oxide.

The covering structure 30 defines the cavity 1 in which the MEMS structure 20 is arranged. The covering structure 30 can have surrounding walls 31, 32, and 34, a first covering layer 36, and a second covering layer 38. It can be said that the cavity 1 is a space defined by the surrounding walls 31, 32, and 34, the first covering layer 36, the second covering layer 38, and the substrate 10.

The surrounding walls 31, 32, and 34 are formed around the cavity 1 on the second under layer 16. In the example shown in FIG. 1, the surrounding walls 31, 32, and 34 are stacked in this order from the side of the second under layer 16. The surrounding walls 31, 32, and 34 may also be referred to as a "guard ring". Although, in the example shown in FIG. 1, the electronic device 100 has surrounding walls of three layers, the number of layers is not particularly limited. For example, the number of layers may be determined according to the number of inter-layer insulating layers.

As shown in FIG. 2, the surrounding walls 31, 32, and 34 have the planar shape which surrounds the MEMS structure 20. The planar shape of the cavity 1 defined by the surrounding walls 31, 32, and 34 is not particularly limited as long as the MEMS structure 20 is housed. For example, the shape may be any shape such as a circular shape or a polygonal shape, and it is quadrilateral in the illustrated example. The surrounding walls 31, 32, and 34 may be electrically connected to one another. The height of each of the surrounding walls 32 and 34 is, for example, from 1 to 1.5 μm. Although not illustrated in FIG. 2, a port for extracting a wire which is electrically connected to the first electrode 22 or the second electrode 24 may be formed in the surrounding wall 31.

The surrounding wall 34 and the first covering layer 36 can be integrally formed as a wiring layer 35. In the example shown in FIG. 1, the wiring layer 35 other than that for the surrounding wall 34 and the first covering layer 36 is not illustrated. However, for example, the wiring layer 35 may be formed so as to form a predetermined wiring pattern, and a part of the predetermined wiring pattern may serve as the surrounding wall 34 and the first covering layer 36. Therefore, the surrounding wall 34 can have the same stacked structure as the first covering layer 36 in a second region 236 described later. The surrounding walls 31 and 32 are configured to include, for example, polycrystalline silicon, a metal such as aluminum, copper, tungsten, or titanium, and an alloy thereof.

As shown in FIG. 1, the first covering layer 36 is formed to cover from above the cavity 1. The first covering layer 36 has a first region 136 and the second region 236.

The first region 136 is located above at least the MEMS structure 20. That is, in plan view as shown in FIG. 2, the first region 136 includes a region overlapping the MEMS structure 20. Although the planar shape of the first region 136 is not particularly limited, the planar shape is circular in the example shown in FIG. 2. In the first region 136 as shown in FIG. 1, a distance L1 between the first covering layer 36 and the substrate 10 (the second under layer 16 in the illustrated example) becomes longer toward the center of the first region, and the maximum distance L1 is, for example, from 1.6 to 3.5 μm. That is, it can be said that the shape of the first covering layer 36 in the first region 136 is an arched shape which is convexed upward. Thus, it is possible to form the cavity 1 into a dome shape.

The first covering layer 36 in the first region 136 has through-holes 37 in communication with the cavity 1. For example, the through-hole 37 is disposed so as to avoid the position directly above the MEMS structure 20. Although, in the example shown in FIG. 2, eight through-holes 37 are disposed, the number of through-holes is not particularly limited.

The second region 236 is located around the first region 136. In the example shown in FIG. 2, the second region 236 surrounds the first region 136. In the second region 236, for example, a distance L2 between the first covering layer 36 and the substrate 10 is constant, and the distance L2 is, for example, from 1.5 to 3 μm. The distance L1 is longer than the distance L2. That is, the first covering layer 36 in the first region 136 is located above the first covering layer 36 in the second region 236.

The first covering layer 36 has a stacked structure in which, for example, a first layer 35a, a second layer 35b, a third layer 35c, and a fourth layer 35d are stacked.

The fourth layer 35d is formed in the second region 236 so as to avoid the first region 136. The fourth layer 35d constitutes the lowermost layer of the first covering layer 36 in the second region 236. The thickness of the fourth layer 35d is, for example, from 10 to 100 nm. Examples of the material of the fourth layer 35d include, for example, Ti. The fourth layer 35d can improve a coverage property for the inter-layer insulating layer 42.

The first layer 35a is formed on the fourth layer 35d in the second region 236 so as to avoid the first region 136. The thickness of the first layer 35a is, for example, from 50 to 200 nm. Examples of the material of the first layer 35a include, for example, TiN. The first layer 35a can prevent the constituent material (Si atoms etc.) of the inter-layer insulating layer 42, an impurity, or the like from entering the second layer 35b.

The second layer 35b is formed in the first region 136 and the second region 236. In the first region 136, the second layer 35b constitutes the lowermost layer of the first covering layer 36. In the second region 236, the second layer 35b is formed on the first layer 35a. The thickness of the second layer 35b is, for example, from 500 to 1000 nm. Examples of the material of the second layer 35b include, for example, Al and an Al—Cu alloy obtained by adding 1 wt % or less Cu to Al. The second layer 35b mainly secures the conductivity of the first covering layer 36.

The third layer 35c is formed on the second layer 35b in the first region 136 and the second region 236. The third layer 35c constitutes the uppermost layer of the first covering layer 36. The thickness of the third layer 35c is, for example, from 20 to 200 nm. Examples of the material of the third layer 35c include, for example, TiN. The third layer 35c can function as an antireflection layer for photo process.

The first layer 35a, the second layer 35b, the third layer 35c, and the fourth layer 35d can have resistance to etching used in a release step of removing the inter-layer insulating layers 40 and 42 described later. Especially the first layer 35a, the third layer 35c, and the fourth layer 35d have high resistance to an etchant mainly containing hydrofluoric acid. Examples of the material having such high resistance include, for example, TiN, Ti, W, Au, and Pt, and an alloy thereof. The material of the first layer 35a, the third layer 35c, and the fourth layer 35d may be the material having such high resistance.

As described above, the second layer 35b and the third layer 35c are stacked in the first region 136, and the fourth layer 35d, the first layer 35a, the second layer 35b, and the third layer 35c are stacked in the second region 236. That is, it can be said that the first covering layer 36 is thinner in the first region 136 than in the second region 236.

Although not illustrated, the third layer 35c may not be formed. Moreover, one of the first layer 35a and the fourth layer 35d may not be formed.

As described above, the surrounding wall 34 can be formed integrally with the first covering layer 36 in the second region 236. That is, the surrounding wall 34 can have the stacked structure in which the fourth layer 35d, the first layer 35a, the second layer 35b, and the third layer 35c are stacked in this order.

It is desirable that a constant potential (for example, a ground potential) is supplied to the surrounding walls 31, 32, and 34 and the first covering layer 36. Thus, the surrounding walls 31, 32, and 34 and the first covering layer 36 can function as an electromagnetic shield. Therefore, the MEMS structure 20 can be electrically shielded from the outside. Thus, the MEMS structure 20 can have more stabilized characteristics and, therefore, have high reliability.

The second covering layer 38 is formed on the first covering layer 36. The second covering layer 38 can close the through-holes 37 of the first covering layer 36. The thickness of the second covering layer 38 is, for example, about 3 μm. Examples of the material of the second covering layer 38 include, for example, Al, Ti, and W. The first covering layer 36 and the second covering layer 38 can function as a sealing member which covers from above the cavity 1 to seal the cavity 1.

The passivation layer 50 is formed on the first covering layer 36 so as to avoid the region where the second covering layer 38 is formed. As the passivation layer 50, for example, a TEOS (tetra-ethoxy-silane) oxide layer or a silicon nitride layer can be used.

The electronic device 100 according to the embodiment has, for example, the following features.

According to the electronic device 100, the first covering layer 36 has the first region 136 located above the MEMS structure 20 and the second region 236 located around the first region 136. The distance L1 between the substrate 10 and the first covering layer 36 in the first region 136 is longer than the distance L2 between the substrate 10 and the first covering layer 36 in the second region 236. That is, the first covering layer 36 in the first region 136 is displaced above the first covering layer 36 in the second region 236. Therefore, the electronic device 100 can prevent the contact between the first covering layer 36 and the MEMS structure 20 due to an external impact or the like, compared with the case where, for example, a flat first covering layer covers the top of a cavity. Accordingly, the electronic device 100 can have high reliability.

According to the electronic device 100, the first covering layer 36 in the first region 136 can have the stacked structure of two layers, and the first covering layer 36 in the second region 236 can have the stacked structure of four layers. That is, the number of stacked layers of the first covering layer 36 is smaller in the first region 136 than in the second region 236. Then, the through-hole 37 can be formed through the first covering layer 36 in the first region 136. Therefore, when the inter-layer insulating layers 40 and 42 are etched through the through-hole 37 to release the MEMS structure 20 (which will be described in detail later), it is possible to prevent a step portion from being formed on the inner wall of the through-hole due to the difference in etching rate between the layers, compared with the case where, for example, the through-hole is formed in the second region having the stacked structure of four layers. Thus, the electronic device 100 can have high reliability.

According to the electronic device 100, the second layer 35b of the first covering layer 36 is, for example, an Al—Cu alloy, and the material of the first layer 35a, the third layer 35c, and the fourth layer 35d of the first covering layer 36 is at least any one of TiN, Ti, W, Au, and Pt, or an alloy thereof. Therefore, the first covering layer 36 can ensure conductivity while having high resistance to an etchant in releasing the MEMS structure 20.

According to the electronic device 100, the planar shape of the first region 136 can be circular. Therefore, in forming the second covering layer 38, stress can be uniformly released at the outer periphery of the first region 136 (which will be described in detail later). For example, when the planar shape of the first region is quadrilateral, stress is concentrated on corners, and, therefore, it is sometimes difficult to stably displace the first covering layer in the first region upward.

2. Method for Manufacturing Electronic Device

Next, a method for manufacturing the electronic device according to the embodiment will be described with reference to the drawings. FIGS. 4 to 11 are cross-sectional views schematically showing the manufacturing process of the electronic device 100 according to the embodiment.

Figure 4:
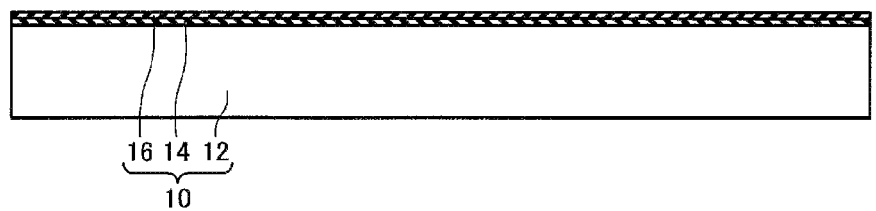
FIG. 4 is a cross-sectional view schematically showing the manufacturing process of the electronic device according to the embodiment.

As shown in FIG. 4, the first under layer 14 and the second under layer 16 are formed in this order on the supporting substrate 12 to obtain the substrate 10. The first under layer 14 is formed by, for example, an STI (shallow trench isolation) method or an LOCOS method. The second under layer 16 is formed by, for example, a CVD (chemical vapor deposition) method or a sputtering method.

Figure 5:
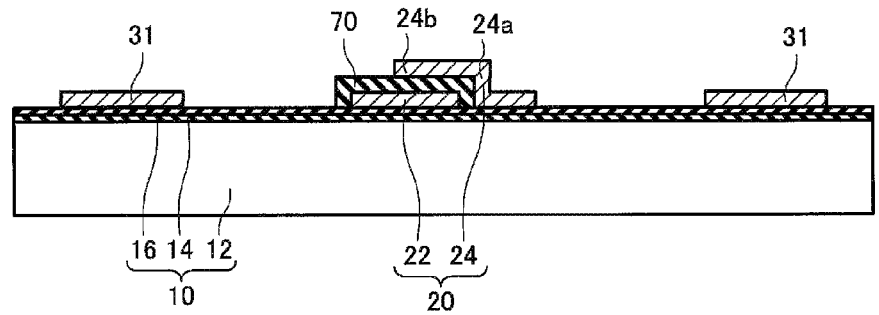
FIG. 5 is a cross-sectional view schematically showing the manufacturing process of the electronic device according to the embodiment.

As shown in FIG. 5, the MEMS structure 20 having the first electrode 22 and the second electrode 24 is formed on the second under layer 16. More specifically, the first electrode 22 is formed by deposition by a CVD method or a sputtering method and then patterning using a photolithographic technique and an etching technique. When the first electrode 22 is made of polycrystalline silicon, polycrystalline silicon is doped with a predetermined impurity to provide conductivity. As shown in FIG. 5, the surrounding wall 31 may be formed in forming the second electrode 24.

Next, a sacrificial layer 70 covering the first electrode 22 is formed by thermal oxidation. Next, the second electrode 24 is formed on the sacrificial layer 70. The second electrode 24 is formed by, for example, a deposition process and a patterning process similar to those of the first electrode 22. When the second electrode 24 is made of polycrystalline silicon, polycrystalline silicon is doped with a predetermined impurity to provide conductivity.

Members of the transistor (not shown) constituting the oscillator circuit 60 may be formed in the same step as the step of forming the MEMS structure 20. Specifically, for example, a gate insulating layer of the transistor may be formed in the step of forming the sacrificial layer 70. Further, a gate electrode of the transistor may be formed in the step of forming the second electrode 24. In this manner, the manufacturing process is commonly used in the MEMS structure 20 and the oscillator circuit 60, whereby the manufacturing process can be simplified.

Figure 6:
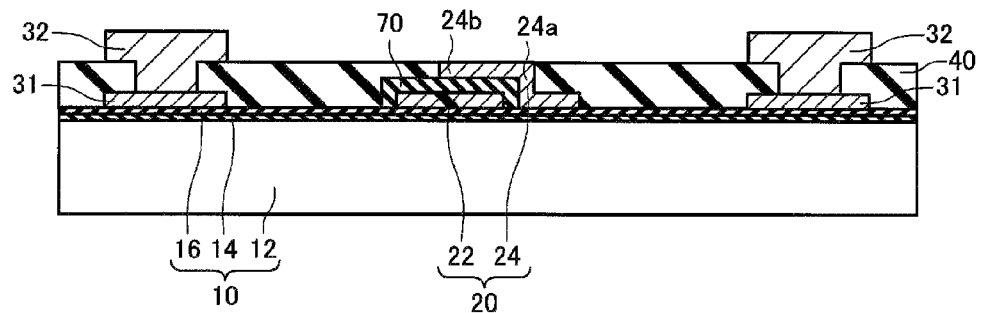
FIG. 6 is a cross-sectional view schematically showing the manufacturing process of the electronic device according to the embodiment.

As shown in FIG. 6, the inter-layer insulating layer 40 is formed on the substrate 10. The inter-layer insulating layer 40 can be formed by, for example, a CVD method, a coating (spin coating) method, or the like. After forming the inter-layer insulating layer 40, the surface of the inter-layer insulating layer 40 may be planarized.

Next, the surrounding wall 32 is formed on the surrounding wall 31 so as to surround the MEMS structure 20. The surrounding wall 32 is formed by, for example, patterning the inter-layer insulating layer 40 to form a contact hole which exposes the surrounding wall 31 and embedding a metal, such as aluminum, into the contact hole.

Figure 7:
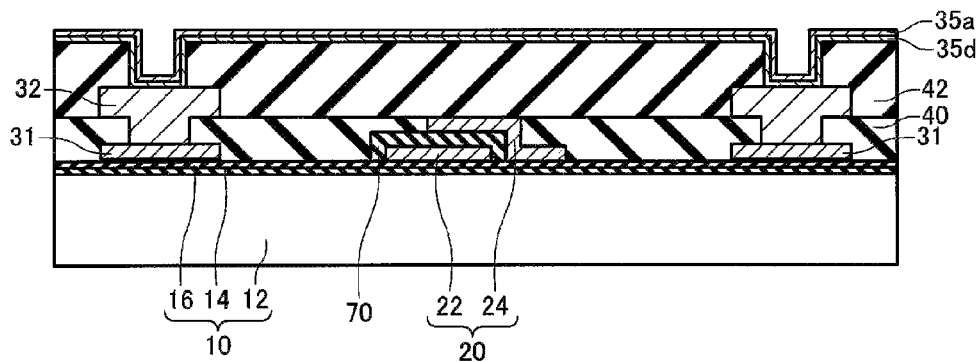
FIG. 7 is a cross-sectional view schematically showing the manufacturing process of the electronic device according to the embodiment.

As shown in FIG. 7, the inter-layer insulating layer 42 is formed on the MEMS structure 20, the surrounding wall 32, and the inter-layer insulating layer 40. The inter-layer insulating layer 42 is formed by a method similar to that of the inter-layer insulating layer 40.

Next, the inter-layer insulating layer 42 is patterned to form a contact hole which exposes the surrounding wall 32, and the fourth layer 35d and the first layer 35a are deposited in this order in the contact hole and on the inter-layer insulating layer 42. The deposition process is performed by, for example, a sputtering method, a CVD method, or a vacuum evaporation method.

Figure 8:
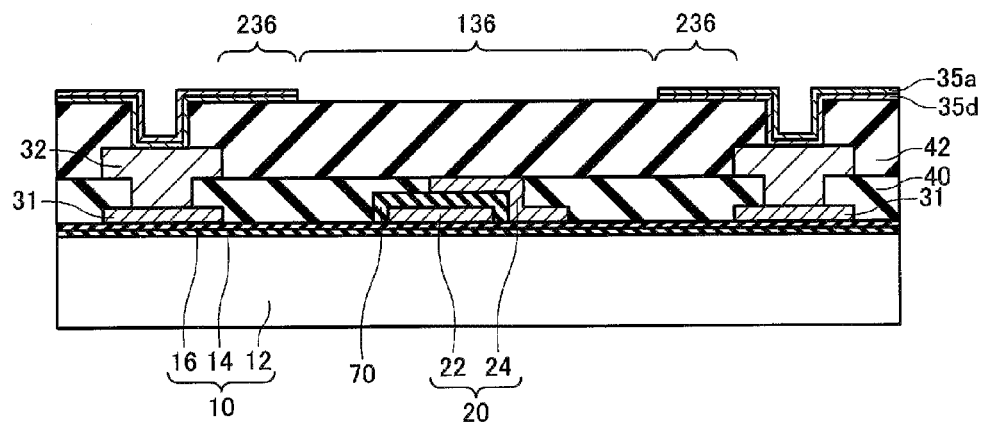
FIG. 8 is a cross-sectional view schematically showing the manufacturing process of the electronic device according to the embodiment.

As shown in FIG. 8, the first layer 35a and the fourth layer 35d are patterned by a photolithographic technique and an etching technique to remove the first layer 35a and the fourth layer 35d in the first region 136. Thus, the inter-layer insulating layer 42 is exposed. For example, the first layer 35a and the fourth layer 35d can be patterned such that the planar shape of the exposed inter-layer insulating layer 42 is circular (that is, such that the first region 136 is circular).

Figure 9:
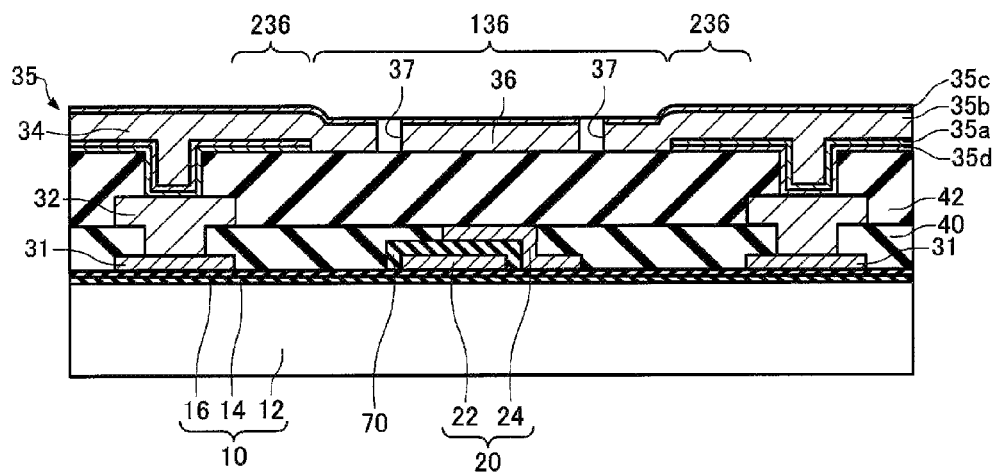
FIG. 9 is a cross-sectional view schematically showing the manufacturing process of the electronic device according to the embodiment.

As shown in FIG. 9, the second layer 35b is formed on the inter-layer insulating layer 42 and on the first layer 35a. Next, the third layer 35c is formed on the second layer 35b. More specifically, the second layer 35b and the third layer 35c are formed by deposition by a sputtering method, a CVD method, a vacuum evaporation method, or the like and then patterning using a photolithographic technique and an etching technique. By the patterning, the through-holes 37 can be formed.

Through the steps described above, the surrounding wall 34 and the first covering layer 36 can be formed integrally as the wiring layer 35. Moreover, the first covering layer 36 can be formed so as to be thinner in the first region 136 than in the second region 236.

Figure 10:
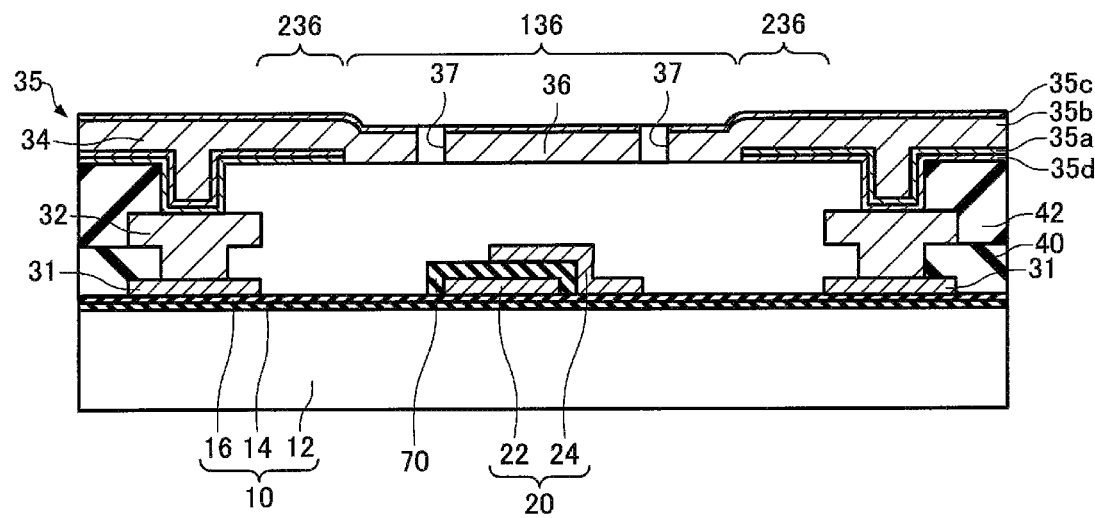
FIG. 10 is a cross-sectional view schematically showing the manufacturing process of the electronic device according to the embodiment.

As shown in FIG. 10, the inter-layer insulating layers 40 and 42 and the sacrificial layer 70 located around and above the MEMS structure 20 are removed through the through-holes 37 to form the cavity 1 (release step). Etching is performed by wet etching using, for example, hydrofluoric acid, buffered hydrofluoric acid (a mixture of hydrofluoric acid and ammonium fluoride), or the like.

As described above, the first layer 35a, the second layer 35b, the third layer 35c, and the fourth layer 35d have resistance to etching used in the release step. Especially the first layer 35a, the third layer 35c, and the fourth layer 35d can have high resistance to an etchant mainly containing hydrofluoric acid. Accordingly, it is possible to prevent the first covering layer 36 from disappearing or becoming thin due to the release step.

As described above, the through-hole 37 can be formed in the first region 136 having the two-layered structure. Therefore, compared with the case where the through-hole 37 is formed in the second region 236 having the four-layered structure, it is possible in the release step to prevent a step portion from being formed on the inner wall of the through-hole due to the difference in etching rate between the layers.

Figure 11:
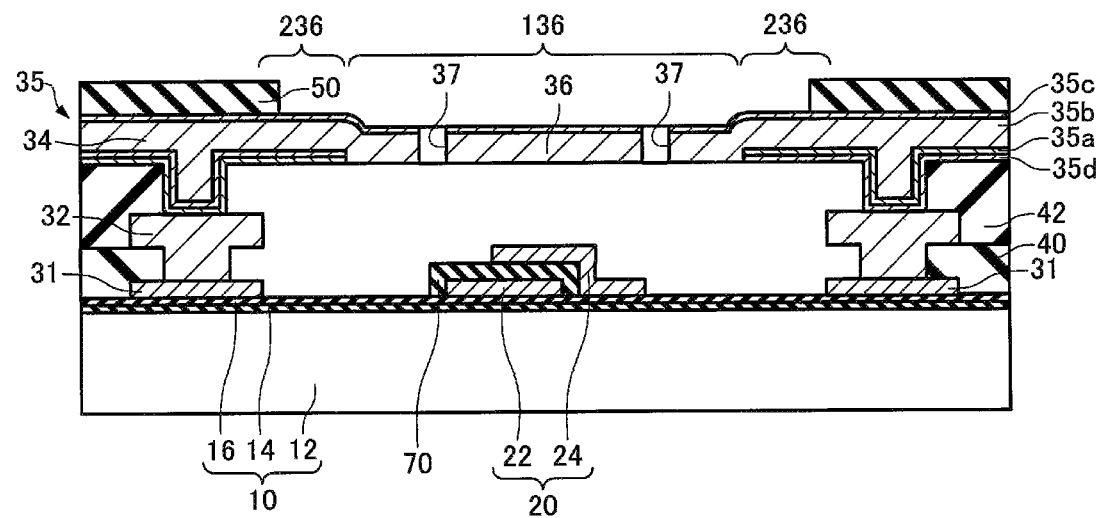
FIG. 11 is a cross-sectional view schematically showing the manufacturing process of the electronic device according to the embodiment.

As shown in FIG. 11, the passivation layer 50 is formed on the first covering layer 36 so as to avoid the region where the second covering layer 38 is formed. The passivation layer 50 is formed by, for example, a sputtering method, a CVD method, or the like.

As shown in FIG. 1, the second covering layer 38 is formed on the first covering layer 36. Thus, the through-holes 37 can be closed, and, therefore, the cavity 1 can be sealed. The second covering layer 38 can be formed by a vapor phase growth method, such as a sputtering method or a CVD method. Thus, the cavity 1 can be sealed while remaining in a reduced pressure state.

Here, stress applied to the first covering layer 36 is released by thermal stress applied in forming the second covering layer 38 by a sputtering method, a CVD method, or the like. At that time, since the first covering layer 36 is thinner in the first region 136 than in the second region 236, the first covering layer 36 in the first region 136 is likely to deform. Therefore, the first covering layer 36 in the first region 136 is displaced above the first covering layer 36 in the second region 236 due to the thermal stress applied in forming the second covering layer 38. That is, the distance L1 between the substrate 10 and the first covering layer 36 in the first region 136 becomes longer than the distance L2 between the substrate 10 and the first covering layer 36 in the second region 236.

As described above, the planar shape of the first region 136 is, for example, circular. Therefore, stress can be released uniformly at the outer periphery of the first region 136 in forming the second covering layer 38. For example, when the planar shape of the first region is quadrilateral, stress is concentrated on corners, and, therefore, it is sometimes difficult to stably displace the first covering layer in the first region upward.

Here, for example, an Al—Cu alloy layer formed by sputtering on the inter-layer insulating layer has such a property that the Al—Cu alloy layer is displaced upward by the release of the stress caused by forming the second covering layer 38. Moreover, since the Al—Cu alloy layer has a large thermal expansion coefficient, the Al—Cu alloy layer expands with heat in forming the second covering layer 38 and, therefore, is likely to be displaced upward. In the electronic device 100, the second layer 35b in the first region 136 is the lowermost layer of the first covering layer 36, and the cavity 1 is formed right below the second layer 35b. Therefore, the second layer 35b in the first region 136 is susceptible to the influence of the stress release, compared with the second layer 35b in the second region 236 below which the first layer 35a and the fourth layer 35d are formed. Therefore, by using an Al—Cu alloy as the material of the second layer 35b, the first covering layer 36 in the first region 136 can be displaced further above the first covering layer 36 in the second region 236.

As described above, the through-hole 37 can be formed so as to avoid the position located right above the MEMS structure 20. Therefore, when the second covering layer 38 is formed, it is possible to prevent the material constituting the second covering layer 38 from passing through the through-hole 37 to adhere to the MEMS structure 20.

Through the steps described above, the electronic device 100 can be manufactured.

The method for manufacturing the electronic device 100 according to the embodiment has, for example, the following features.

According to the method for manufacturing the electronic device 100, the first covering layer 36 in the first region 136 is displaced above the first covering layer 36 in the second region 236 by the step of forming the second covering layer 38 as described above. That is, it is possible to make the distance L1 between the substrate 10 and the first covering layer 36 in the first region 136 longer than the distance L2 between the substrate 10 and the first covering layer 36 in the second region 236. Therefore, it is possible to prevent the contact between the MEMS structure 20 and the first covering layer 36.

While the embodiment of the invention has been described above in detail, those skilled in the art should readily understand that many modifications can be made without departing in substance from the novel matter and effects of the invention. Accordingly, all of those modified examples are deemed to be included in the scope of the invention.

The entire disclosure of Japanese Patent Application No. 2010-245974, filed Nov. 2, 2010 is expressly incorporated by reference herein.

What is claimed is:

1. An electronic device comprising:
   a substrate;
   an MEMS structure formed above the substrate; and
   a covering structure defining a cavity in which the MEMS structure is arranged, wherein
   the covering structure has
      a first covering layer covering from above the cavity and having a through-hole in communication with the cavity, and
      a second covering layer formed above the first covering layer and closing the through-hole,
   the first covering layer has, in a plan view from a thickness direction of the substrate,
      a first region located above at least the MEMS structure, and
      a second region located around the first region,
   the first covering layer is thinner in the first region than in the second region,
   a distance between the substrate and the first covering layer in the first region is longer than a distance between the substrate and the first covering layer in the second region,
   the through-hole is formed in the first region between the MEMS structure and the second region in the plan view,
   the second covering layer is formed above the first covering layer located above the MEMS structure, and
   a first thickness of the second covering layer that is formed in and above the through-hole is the same as a second thickness that is obtained by combining thicknesses of the first and second covering layers located above the MEMS structure.

2. The electronic device according to claim 1, wherein the first covering layer has
   a first layer formed in the second region so as to avoid the first region, and
   a second layer formed in the first region and the second region.

3. The electronic device according to claim 2, wherein
   the first covering layer further has a third layer formed in the first region and the second region,
   the first layer is formed below the second layer,
   the third layer is formed above the second layer,
   the material of the second layer is an Al—Cu alloy, and
   the material of the first layer and the third layer is at least any one of TiN, Ti, W, Au, and Pt, or an alloy thereof.

4. The electronic device according to claim 1, wherein the planar shape of the first region is circular.

5. The electronic device according to claim 1, wherein the MEMS structure includes
   a first electrode formed above the substrate and
   a second electrode having a supporting portion formed above the substrate and a beam portion extending from the supporting portion and arranged to face the first electrode.

6. The electronic device according to claim 5, further comprising an oscillator circuit for oscillating the MEMS structure.

* * * * *